United States Patent [19]

Seelbach

[11] 4,243,898
[45] Jan. 6, 1981

[54] SEMICONDUCTOR TEMPERATURE SENSOR

[75] Inventor: Walter C. Seelbach, Scottsdale, Ariz.

[73] Assignee: Motorola, Inc., Schaumburg, Ill.

[21] Appl. No.: 961,307

[22] Filed: Nov. 16, 1978

[51] Int. Cl.³ .................. H01L 31/00; H03K 3/26; G06G 7/24
[52] U.S. Cl. ................... 307/310; 307/229; 307/296 R; 328/145
[58] Field of Search ............ 307/229, 310, 296; 328/145; 323/22 T, 8, 18; 330/288; 73/362 SC

[56] References Cited

U.S. PATENT DOCUMENTS

| 3,611,171 | 10/1971 | Black | 330/288 |
|---|---|---|---|
| 3,809,929 | 5/1974 | Vittoz | 307/310 |
| 4,004,462 | 1/1977 | Dobkin | 323/8 |
| 4,029,974 | 5/1977 | Brokaw | 307/310 |
| 4,123,698 | 10/1978 | Brokaw | 307/299 B |
| 4,138,616 | 2/1979 | Turner | 307/310 |

*Primary Examiner*—Stanley D. Miller, Jr.
*Assistant Examiner*—B. P. Davis
*Attorney, Agent, or Firm*—Charles R. Lewis

[57] ABSTRACT

A temperature sensor circuit is disclosed which employs a plurality of semiconductor junctions arranged either in a current-mirror configuration or a bridge configuration in order to provide a differential output voltage which is linearly proportional to temperature. The temperature sensor circuit is ideally suited for fabrication as an integrated circuit, and the differential output voltage is relatively insensitive to integrated circuit processing variations as well as power supply variations. By providing a differential output signal, the circuit is particularly useful in high noise environments such as automotive applications.

9 Claims, 4 Drawing Figures

SEMICONDUCTOR TEMPERATURE SENSOR

RELATED APPLICATIONS

"Modified Semiconductor Temperature Sensor," invented by Marvin A. Glazer, bearing Ser. No. 961,308, filed on even date herewith and assigned to the assignee of the present invention.

TECHNICAL FIELD

This invention relates generally to semiconductors and, more particularly, to a semiconductor temperature sensing circuit.

BACKGROUND ART

As the microprocessor finds increasingly wider applications in controlling systems, the need for reliable and low cost sensors and transducers for interfacing between the microprocessor and the system to be controlled has grown rapidly. One such example is the application of microcomputers for controlling automobile engines. An overview of such an application may be found in "Automotive Electronics II: The Microprocessor Is In" by Puckett et al, IEEE Spectrum, Vol. 14, No. 11, November 1977. This article calls attention to the current unavailibility of efficient, low cost sensors and transducers.

Desirable features of a temperature sensor circuit include suitability for implementation with monolithic integrated circuit technology, implementation with a relatively small number of components, insensitivity to process variations from wafer to wafer, and insensitivity to variations in the power supply voltage applied to the temperature sensing circuit. The analog output signal should vary linearly with temperature in order to allow for conventional analog-to-digital conversion techniques. In addition, a differential output signal is a desired feature when the temperature sensor is to be used in a high noise environment in order to benefit from the advantages of common mode noise rejection. It will be appreciated by those skilled in the art that a temperature sensor circuit which includes all of the desired features mentioned above is a significant improvement over the prior art.

BRIEF SUMMARY OF THE INVENTION

It is an object of the present invention to provide a circuit for sensing temperature which may easily be fabricated with present integrated circuit technology.

It is another object of the present invention to provide a semiconductor temperature sensor which generates a differential output signal that varies linearly with temperature.

A further object of the present invention is to provide a semiconductor temperature sensor which generates an output signal that is relatively insensitive to power supply variations as well as variations in semiconductor processing.

In accordance with these and other objects, the present invention relates to a temperature sensor circuit which includes a first semiconductor junction for conducting a first current and for generating a first voltage, and at least a second semiconductor junction for conducting a second current and for generating a second voltage. The present invention also includes circuitry adapted for coupling to a power supply for providing the first and second currents, and circuitry for maintaining the first and second currents in a predetermined relationship. Also included is output circuitry which receives the first and second voltages generated by the first and at least second semiconductor junctions for providing a differential output voltage which has a magnitude that is linearly proportional to temperature. One embodiment of the present invention employs a current mirror circuit arrangement for maintaining the first and second currents in the predetermined relationship. At a given temperature, the magnitude of the differential output voltage is related to the ratio of the junction areas of the first and at least second semiconductor junctions and is related to the predetermined relationship of the first and second currents.

DETAILED DESCRIPTION OF THE INVENTION

Figure 1:
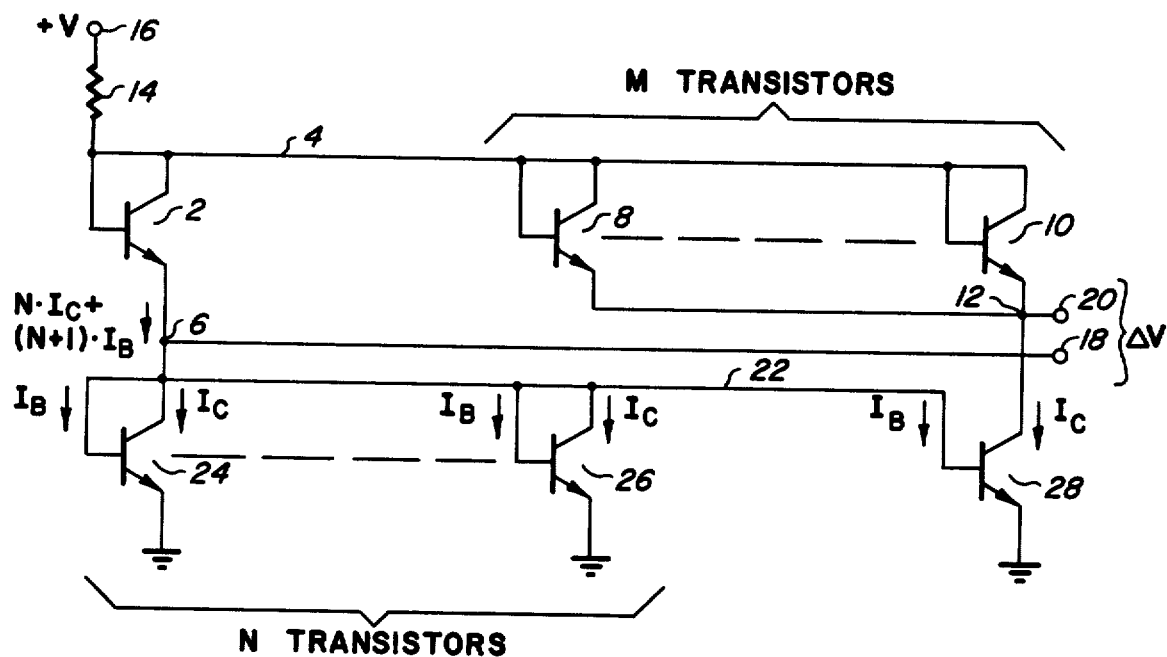
FIG. 1 is a circuit diagram which illustrates a first embodiment of the present invention.

FIG. 1 is a circuit diagram of a temperature sensor circuit according to one embodiment of the present invention. Transistor 2 has its base and collector terminals coupled to conductor 4 and its emitter terminal coupled to node 6, such that transistor 2 is diode-connected and conducts a first current from conductor 4 to node 6. Those skilled in the art will realize that transistor 2 may be replaced by a semiconductor diode having its anode coupled to conductor 4 and its cathode coupled to node 6. Transistors 8 and 10 are also diode-connected and are coupled in parallel with each other such that the base and collector terminals of both transistors 8 and 10 are coupled to conductor 4 while the emitter terminals of transistors 8 and 10 are coupled to node 12. It will again be realized that transistor 8 and transistor 10 may each be replaced with a semiconductor diode having its anode coupled to conductor 4 and its cathode coupled to node 12.

In FIG. 1, the dashed lines drawn between transistor 8 and transistor 10 indicate that additional diode-connected transistors may be coupled in parallel with transistors 8 and 10 such that the total number of parallel-coupled transistors is equal to M. It is assumed that each of the M transistors coupled between conductor 4 and node 12 has the same characteristics as transistor 2 such that the emitter-base semiconductor junction areas of each of the M transistors is the same as that of transistor 2. However, those skilled in the art will realize that a single transistor having an emitter-base semiconductor junction area equal to M times the emitter-base junction area of transistor 2 could be substituted for the group of M transistors illustrated in FIG. 1. Collectively, the group of M transistors conduct a second current from conductor 4 to node 12.

Conductor 4 is coupled by resistor 14 to a terminal 16 which is adapted to be coupled to a positive voltage supply +V for supplying the first and second currents to conductor 4. The first current flowing through transistor 2 causes a first voltage to be established at node 6 which differs from the voltage of conductor 4 in accordance with the emitter-base junction voltage drop across transistor 2. A first output terminal 18 is coupled to node 6 for receiving the first voltage. Similarly the second current which flows collectively through transistors 8 through 10 causes a second voltage to be established at node 12 which differs from the voltage of conductor 4 in accordance with the base-emitter junction voltage drop across each of these transistors. A second output terminal 20 is coupled to node 12 for receiving this second voltage. Output terminals 18 and 20 provide a differential output voltage corresponding to the difference in voltages at nodes 6 and 12. As will be later explained, this differential output voltage is linearly proportional to temperature.

Still referring to FIG. 1, node 6 is coupled to conductor 22. Transistor 24 is diode-connected such that its base and collector terminals are coupled to conductor 22 and its emitter terminal is coupled to a source of ground potential. Diode-connected transistor 26 has its base and collector terminals coupled to conductor 22 and has its emitter terminal coupled to the source of ground potential such that transistor 26 is coupled in parallel with transistor 24. The dashed lines illustrated in FIG. 1 between transistor 24 and transistor 26 indicate that additional transistors may be coupled in parallel with transistor 24 such that the total number of diode-connected transistors coupled between conductor 22 and ground potential is equal to N. Collectively, the group of N transistors conducts the first current from node 6 to ground potential and establishes the voltage on conductor 22 relative to ground potential in accordance with the base-emitter junction voltage drop across each of the group of N transistors.

Transistor 28 has its base terminal coupled to conductor 22 and its emitter terminal coupled to ground potential such that the voltage established on conductor 22 regulates the collector current drawn by transistor 28. The collector terminal of transistor 28 is coupled to node 12 for regulating the second current conducted by the group of M transistors 8 through 10. In this manner, the group of N transistors 24 through 26 in combination with transistor 28 serve as a means for maintaining the first and second currents in a predetermined relationship. Because the voltage across the base-collector junction of transistor 28 is near zero bias ($\Delta V$ is much smaller than 1 volt in magnitude), and because the base-collector junctions of transistors 24 through 26 are all at zero bias, the base and collector current components of transistor 28 closely match the corresponding current components of each of the transistors 24 through 26.

Those skilled in the art will recognize that transistors 24 through 26 and transistors 28 in FIG. 1 are connected as a current mirror circuit. It is assumed that each of the transistors 24 through 26 in the group of N transistors is identical to transistor 28 such that the emitter-base junction area of transistor 24 is equal to that of transistor 28. However it will be recognized that the group of N transistors 24 through 26 may be replaced by a single transistor having an emitter-base junction area which is N times the emitter-base junction area of transistor 28. Those skilled in the art will also recognize that transistors 24 through 26 may be replaced with semiconductor diodes having their anodes coupled to conductor 22 and their cathodes coupled to ground potential.

The expression for the differential output voltage provided by output terminals 18 and 20 in FIG. 1 will now be developed. The first current which flows across transistor 2 may be expressed in terms of the base current ($I_B$) and the collector current ($I_C$) components of transistors 24 through 26 and transistor 28. The first current includes N components of collector current $I_C$ and N+1 components of base current $I_B$. The second current may be expressed simply as a single collector component $I_C$ such that each of the group of M transistors 8 through 10 conducts a current equal to $I_C/M$. As is well known in the art, the voltage across a semiconductor junction may be expressed in terms of the current flowing through the junction as $$V = \frac{kT}{q} \ln \frac{I}{I_o}$$

where k is Boltzmann's constant, T is the temperature, q is the magnitude of the charge on an electron, and $I_o$ is the reverse saturation current of the semiconductor junction. For further details, see *Fundamentals of Semiconductor Devices* by Lindmayer and Wrigley, Van Nostrand Rheinhold Company, 1965. Thus the difference between the voltage at node 6 and the voltage at node 12 may be expressed as $$\Delta V = \frac{kT}{q} \cdot \ln\left[\frac{N \cdot I_C + (N+1) \cdot I_B}{I_O}\right] - \frac{kT}{q} \cdot \ln\left[\frac{I_C/M}{I_O}\right]$$

This expression may be simplified to $$\Delta V = \frac{kT}{q} \cdot \ln\left[\frac{N \cdot I_C + (N+1) \cdot I_B}{I_C/M}\right].$$

Upon further simplification the expression becomes $$\Delta V = \frac{kT}{q} \cdot \ln\left[N \cdot M + \frac{M(N+1)}{\beta}\right]$$

where $\beta$ is the current amplification factor for transistors 24 through 26 and transistor 28. Assuming that $\beta$ is large relative to M and N, then the expression for the differential output voltage may be simplified to $$\Delta V = \frac{kT}{q} \ln NM.$$

From this expression, it may be seen that the differential output voltage $\Delta V$ is linearly proportional to temperature. It will also be seen that the magnitude of the differential output voltage $\Delta V$ is proportional to the natural logarithm of the quantity N times M.

Although the operating characteristics of the transistors shown in the circuit of FIG. 1 will vary from one processed wafer to another, the operating characteristics of transistor 2 will always be identical to the operating characteristics of transistors 8 through 10 on a given die of any wafer. Therefore the differential output voltage $\Delta V$ is immune from the effects of processing variations. Also, the voltage applied to terminal 16 may vary such that the magnitude of the currents conducted by transistor 2 and transistors 8 through 10 may also vary. However, the current mirror circuitry formed by transistors 24 through 26 and transistor 28 maintains the ratio of these currents in the predetermined relationship such that the differential output voltage is relatively immune from variations in the supply voltage. Finally it will be recognized by those skilled in the art that N or M may each be equal to 1 provided that they are not both equal to 1 at the same time.

Figure 2:
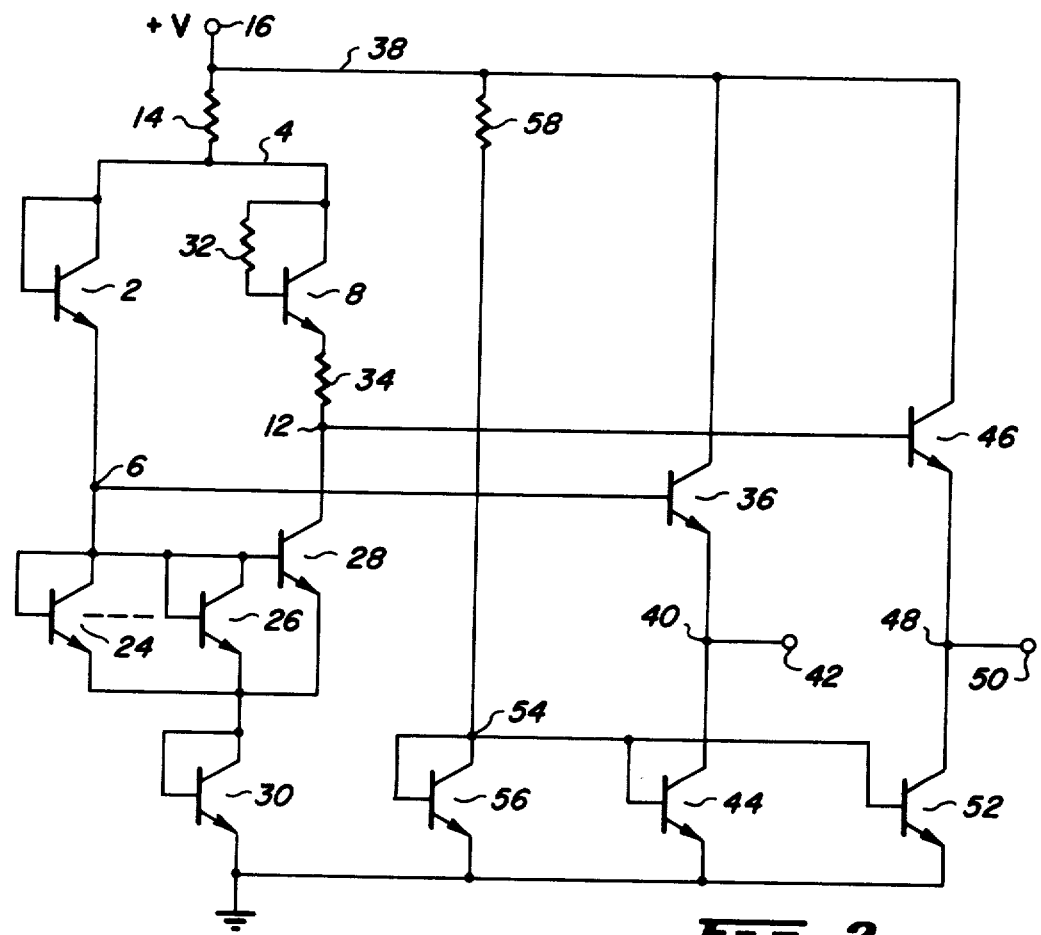
FIG. 2 is a circuit diagram of an alternate embodiment of the present invention but which has been modified to include output drive circuitry.

Shown in FIG. 2 is an alternate embodiment of the present invention in which the circuit of FIG. 1 has been modified to allow the addition of emitter-follower output drivers. Circuit components which correspond to the circuit in FIG. 1 have been numbered using the same reference numerals. In this circuit, M has been chosen to equal 1 and therefore transistor 10 has been omitted. Diode-connected transistor 30 has been inserted between the emitter terminals of transistors 24 through 26 and ground potential and between the emitter terminal of transistor 28 and ground potential in order to make the voltages at nodes 6 and 12 more positive with respect to ground. It is necessary to make these voltages more positive since transistors 36 and 46 translate these voltages by one base-emitter drop toward ground potential in order to generate the differential output voltage. Resistor 32 has been inserted between the base and collector terminals of transistor 8, and resistor 34 has been inserted between the emitter terminal of transistor 8 and node 12. The purpose of resistors 32 and 34 will be explained hereinafter.

Node 6 is coupled to the base of emitter-follower transistor 36 which has its collector terminal coupled to positive supply voltage terminal 16 by conductor 38. The emitter of transistor 36 is coupled to node 40, and node 40 is coupled to first output terminal 42. Node 40 is also coupled to the collector terminal of current source transistor 44. Node 12 is coupled to the base terminal of emitter-follower transistor 46 which has its collector terminal coupled to conductor 38. The emitter terminal of transistor 46 is coupled to node 48, and node 48 is coupled to second output terminal 50. The first and second output terminals 42 and 50 provide the differential output voltage. Node 48 is also coupled to the collector terminal of current source transistor 52.

Transistors 44 and 52 each have their emitter terminals coupled to ground potential and their base terminals coupled to node 54. A bias voltage is generated at node 54 by diode-connected transistor 56 which is coupled between node 54 and ground potential. Resistor 58 is coupled between conductor 38 and node 54 for supplying a bias current to transistor 56. Transistors 44 and 52 are matched such that their collector currents are equal. Similarly transistors 36 and 46 are matched such that the base current components of these transistors are equal. Assuming that transistors 36 and 46 each have a relatively high $\beta$, then these base current components will be relatively small in magnitude such that the ratio of the current conducted by transistor 8 and by transistor 2 will still correspond to the predetermined relationship fixed by transistors 24 through 26 and transistor 28. The addition of emitter-follower transistors 36 and 46 allows the temperature sensor circuit to drive subsequent circuitry (not shown) without significantly loading down the temperature sensor circuit.

In the circuit of FIG. 2, it is assumed that transistors 2 and 8 are matched transistors. Furthermore, each of these transistors has an intrinsic base resistance component $r_b$ and an intrinsic emitter resistance component $r_e$. Because the emitter current of transistor 2 is approximately N times the emitter current of transistor 8, the voltage drops which are produced across the emitter resistance and base resistance of transistor 2 will be greater than the voltage drops across the corresponding resistive components of transistor 8. Therefore, if the currents conducted by transistor 2 and transistor 8 are allowed to vary, as may occur when the positive supply voltage applied to terminal 16 is allowed to vary, then the voltage difference across nodes 6 and 12 will vary slightly even if the temperature remains constant. Resistors 32 and 34 are included in the circuit of FIG. 2 to compensate for this effect.

If it is assumed that the emitter current of transistor 8 is $I_C$ corresponding to the collector current of transistor 28, and if the number of transistors 24 through 26 is equal to N, then the emitter current of transistor 2 may be expressed as $$I_e = I_C \cdot \left[ N + \frac{N+1}{\beta} \right]$$

where $\beta$ corresponds to the amplification factor of transistors 24 through 26 and transistor 28. It may then be shown that resistor 32 should equal $r_b \cdot (N-1)$ and that resistor 34 should equal $r_e \cdot (N-1)$ in order to equalize the voltage drops across the resistive components of transistor 2 and transistor 8. Resistor 32 can be formed during the same semiconductor diffusion process used to form the base region for transistor 8. Similarly resistor 34 may be formed during the same diffusion process used to form the emitter region of transistor 8. In this manner, the variations in resistors 32 and 34 due to changes in processing will track with the actual inherent resistive components of transistor 2 and transistor 8.

Figure 3:
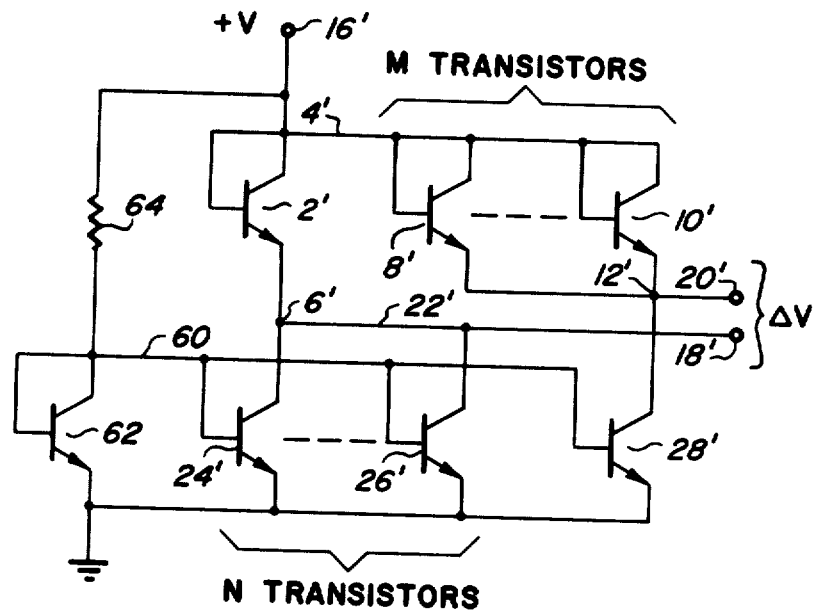
FIG. 3 is a circuit diagram which illustrates a modified temperature sensor circuit of the general type shown in FIG. 1.

Shown in FIG. 3 is a modified temperature sensor circuit of the general type shown in FIG. 1. This circuit is similar to that shown in FIG. 1, and corresponding components have been numbered accordingly. With reference to FIG. 1, resistor 14 has been removed such that conductor 4' is directly coupled to the positive supply terminal 16'. This allows the output voltages provided by output terminals 18' and 20' to be referenced relative to the positive supply voltage rather than referenced to ground potential as was true in FIG. 1. Also the base terminals of transistors 24' through 26' and the base terminal of transistor 28' are no longer coupled to conductor 22', but rather have been coupled to conductor 60. Conductor 60 is coupled by diode-connected transistor 62 to ground potential. Conductor 60 is also coupled by resistor 64 to positive supply terminal 16'. Resistor 64 supplies a bias current to transistor 62 for generating a bias voltage on conductor 60. The bias voltage on conductor 60 causes each of the transistors 24' through 26' and 28' to conduct a collector current equal to the collector current of transistor 62. Thus the emitter current conducted by transistor 2' is N times the current conducted collectively by transistors 8' through 10'. Since none of the base terminals of transistors 24' through 26' is coupled to conductor 22', none of the base current components of transistors 24' through 26' is conducted by transistor 2'. The differential output voltage provided by output terminals 18' and 20' is again linearly proportional to temperature and is proportional to the natural logarithm of N times M.

Figure 4:
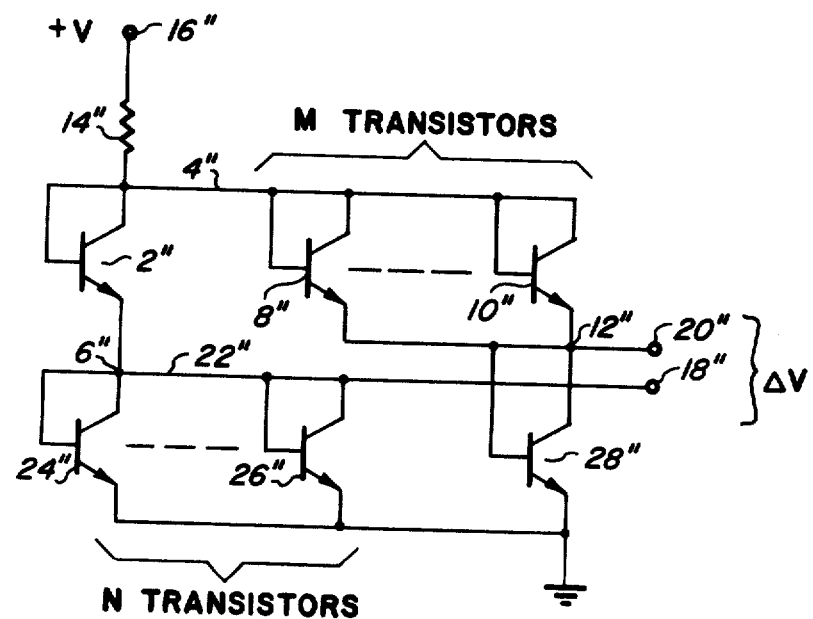
FIG. 4 is a circuit diagram which illustrates another modified temperature sensor circuit of the general type shown in FIG. 1 and which uses a bridge-type arrangement.

Shown in FIG. 4 is another modified temperature sensor circuit of the general type shown in FIG. 1 wherein the semiconductor junctions are arranged in a true bridge configuration. The circuit is similar to the circuit shown in FIG. 1, and corresponding devices have been numbered accordingly. However, it will be noted that the base terminal of transistor 28" is not coupled to conductor 22", but is rather coupled to node 12". Thus in FIG. 4, a current mirror arrangement is not used to maintain the predetermined relationship between the current conducted by transistor 2" and the current conducted collectively by transistors 8" through 10". In this circuit, all transistors are matched to each other. Since the sum of the voltage across transistor 24" plus the voltage across transistor 2" must be equal to the sum of the voltage across transistor 28" plus the voltage across transistor 8", it can be shown that the differential output voltage ΔV provided by output terminals 18" and 20" is $$\Delta V = \frac{kT}{2q} \ln (NM) .$$

Alternatively, this may be expressed as $$\Delta V = \frac{kT}{q} \ln \sqrt{NM} .$$

While the invention has been described with reference to a plurality of preferred embodiments, the description is for illustrative purposes only and is not to be construed as limiting the scope of the invention. For example, it will be apparent to those skilled in the art that the circuits illustrated by FIG. 1 through FIG. 4 may also be implemented with PNP transistors rather than NPN transistors as shown. Various modifications and changes may occur to those skilled in the art without departing from the true spirit and scope of the invention as defined in the appended claims.

What is claimed is:

1. A temperature sensor circuit for providing an indication of temperature comprising:
   (a) first semiconductor junction means for conducting a first current therethrough and for generating a first voltage thereacross;
   (b) at least second semiconductor junction means for conducting a second current therethrough and for generating a second voltage thereacross;
   (c) third means coupled to said first and at least second semiconductor junction means and adapted for coupling to a power supply for providing said first and second currents;
   (d) fourth means coupled to said first and at least second semiconductor junction means for maintaining said predetermined relationship; and
   (e) output means coupled to said first and said at least second semiconductor junction means, respectively, for providing said first and second voltages as a differential output voltage having a magnitude which is linearally proportional to temperature;
   (f) said first semiconductor junction means having a predetermined junction area and said at least second semiconductor junction means having a junction area equal to M times said predetermined junction area.

2. A temperature sensor circuit as recited in claim 1 wherein said first and at least second semiconductor junctions each include first and second terminals, the first terminal of said first semiconductor junction being coupled to the first terminal of said at least second semiconductor junction, the second terminal of said first semiconductor junction being coupled to said output means for providing said first voltage, and the second terminal of the at least second semiconductor junction being coupled to said output means for providing said second voltage.

3. A temperature sensor circuit as recited in claim 2 wherein said first and at least second semiconductor junctions each comprise diode-connected transistors.

4. A temperature sensor circuit as recited in claim 2 wherein said fourth means includes a current-mirror circuit responsive to said first current for regulating said second current such that said second current is maintained in said predetermined relationship with said first current.

5. A temperature sensor circuit as recited in claim 1 wherein said fourth means is effective to maintain said first current equal to N times said second current such that said differential output voltage is proportional to the natural logarithm of the quantity M times N.

6. A temperature sensor circuit for providing an indication of temperature comprising:
   (a) a first semiconductor junction having a predetermined junction area for conducting a first current and for generating a first voltage across said first semiconductor junction;
   (b) a plurality M of semiconductor junctions coupled in parallel with each other for conducting a second current and for generating a second voltage across said plurality M of semiconductor junctions, each of said plurality M of semiconductor junctions having said predetermined junction area;
   (c) first means coupled to said first semiconductor junction and to said plurality M of semiconductor junctions and being adapted for coupling to a power supply for providing said first and second currents;
   (d) second means coupled to said first semiconductor junction and to said plurality M of semiconductor junctions for maintaining the magnitude of said first current equal to N times the magnitude of said second current; and
   (e) output means coupled to said first semiconductor junction for receiving said first voltage and coupled to said plurality M of semiconductor junctions for receiving said second voltage, said output means providing a differential output voltage having a magnitude which is linearly proportional to temperature.

7. A temperature sensor circuit as recited in claim 6 wherein the magnitude of said differential output voltage is proportional to the natural logarithm of the quantity M times N.

8. A temperature sensor circuit as recited in claim 7 wherein said second means comprises:
   (a) a plurality N of semiconductor junctions coupled in parallel with each other and coupled to said first semiconductor junction for conducting said first current, said plurality N of semiconductor junctions being responsive to said first current for generating a bias voltage; and
   (b) a transistor having emitter, base, and collector terminals, the collector terminal being coupled to said plurality M of semiconductor junctions for conducting said second current, and the base and emitter terminals being coupled to said plurality N of semiconductor junctions and being responsive to the bias voltage for regulating said second current.

9. A temperature sensor circuit as recited in claim 7 wherein said second means comprises:
(a) a semiconductor junction coupled to said first means for conducting a bias current and for generating a bias voltage;
(b) a first transistor coupled to said plurality M of semiconductor junctions for conducting said second current, said first transistor being responsive to the bias voltage for regulating said second current; and
(c) a plurality N of transistors coupled in parallel with each other and coupled to said first semiconductor junction for conducting said first current, said plurality N of transistors being responsive to the bias voltage for regulating said first current.

* * * * *